US006137342A

United States Patent [19]

McAdams et al.

[11] Patent Number: 6,137,342

[45] Date of Patent: Oct. 24, 2000

[54] HIGH EFFICIENCY SEMICONDUCTOR SUBSTRATE BIAS PUMP

[75] Inventors: Hugh P. McAdams, McKinney; Ching-Yuh Tsay, Richardson, both of Tex.

[73] Assignee: Texas Instruments Incorporated, Dallas, Tex.

[21] Appl. No.: 08/343,276

[22] Filed: Nov. 22, 1994

Related U.S. Application Data

[63] Continuation of application No. 07/975,494, Nov. 10, 1992, abandoned.

[51] Int. Cl.[7] .......... H03K 3/01

[52] U.S. Cl. .......... 327/534; 327/536; 327/537

[58] Field of Search .......... 307/296.2, 296.6, 307/296.8, 304, 296.3, 263; 327/536, 548, 544, 543, 534, 530, 326; 326/81

[56] References Cited

U.S. PATENT DOCUMENTS

| | | | |
|---|---|---|---|
| 3,808,468 | 4/1974 | Ludlow et al. | 307/296.2 |
| 3,942,047 | 3/1976 | Buchanan | 307/297 |
| 4,336,466 | 6/1982 | Sud et al. | 307/296.2 |
| 4,471,290 | 9/1984 | Yamaguchi | 307/296.6 |
| 4,494,223 | 1/1985 | Reddy et al. | 365/233 |
| 4,581,546 | 4/1986 | Allan | 307/297 |
| 4,585,954 | 4/1986 | Hashimoto et al. | 307/296 |
| 4,628,215 | 12/1986 | Lou | 307/297 |
| 4,631,421 | 12/1986 | Inoue et al. | 307/297 |
| 4,733,108 | 3/1988 | Truong | 307/304 |
| 5,038,325 | 8/1991 | Douglas et al. | 365/189 |
| 5,343,087 | 8/1994 | Furuyama | 322/534 |

*Primary Examiner*—Dinh T. Le
*Attorney, Agent, or Firm*—Robert N. Rountree; Wade James Brady, III; Frederick J. Telecky, Jr.

[57] ABSTRACT

An integrated circuit substrate bias pumping arrangement includes a charge pump circuit arranged as a circuit path from an oscillator input to a substrate. The charge pump circuit operates to supply charge to the substrate in response to a level of the oscillator signal. In the charge pump circuit, a pumping transistor transfers stored charge from a pumping capacitor to the substrate without imparting all of a threshold voltage of the pumping transistor as a voltage loss. The pumping transistor has its conduction path connected in a series circuit between the pumping capacitor and the substrate. A control gate electrode of the pumping transistor is bootstrapped to turn on the pumping transistor by a delayed version of the input signal used for pumping stored charge from the pumping capacitor to the substrate. Two of the charge pump circuits can be operated in a push-pull configuration, substrate bias pump.

13 Claims, 4 Drawing Sheets

HIGH EFFICIENCY SEMICONDUCTOR SUBSTRATE BIAS PUMP

This application is a Continuation of application Ser. No. 07/975,494, filed Nov. 10, 1992, and now abandoned.

FIELD OF THE INVENTION

This invention relates to a semiconductor device and more particularly to a semiconductor device substrate bias pump circuit.

BACKGROUND OF THE INVENTION

Many modern integrated circuits such as microprocessor and dynamic random access memory (DRAM) devices are fabricated in complementary-metal-oxide-semiconductor (CMOS) technology, where both p-channel and n-channel metal-oxide-semiconductor (MOS) transistors are formed in the same semiconductor substrate. CMOS technology combines good performance with low power consumption. The alternating p-type and n-type architecture of CMOS technology creates parasitic thyristors, or silicon controlled rectifiers (SCRs). The p-n-p-n structure of an SCR device can be analyzed as a bipolar p-n-p transistor and a bipolar n-p-n transistor interconnected to form a regenerative feedback pair. If a signal or spurious voltage exceeding the forward breakover voltage of such a parasitic SCR is applied across the device, an undesirable latchup condition can occur. Once latchup occurs, a sufficient magnitude of current can be drawn through the SCR to damage the integrated circuit device.

One technique for reducing the likelihood of latchup of the parasitic SCR is to supply a substrate bias potential that is more negative than the ground, or common, potential of the integrated circuit. The presence of the greater negative substrate bias potential can ensure that a base-emitter junction of one of the two bipolar transistors in the parasitic SCR does not become forward-biased for any expected excursions of voltages applied to the CMOS integrated circuit. A preferred technique for providing a substrate bias potential that is more negative than the ground potential of the integrated circuit is by way of a substrate bias pump circuit. The following patents assigned to Texas Instruments Incorporated provide examples of substrate bias pump circuits: U.S. Pat. No. 4,494,223, issued Jan. 15, 1985; U.S. Pat. No. 4,585,954, issued Apr. 29, 1986; U.S. Pat. No. 4,628,215, issued Dec. 9, 1986; and, U.S. Pat. No. 4,631,421, issued Dec. 23, 1986.

Memory devices and microprocessors are typically powered by an external voltage supply providing a potential, either $V_{dd}$ or $V_{cc}$, of about 5 volts. It is desirable to operate battery powered laptop computers at lower supply potentials of approximately 2 volts.

This mismatch between system and device requirements causes particular concern with respect to the level of substrate bias potential $V_{bb}$ for a DRAM device. DRAM devices are very sensitive to sub-threshold leakage characteristics since they rely upon a separate transistor switch to isolate each capacitor storage element while it is storing data. As the number of storage cells on a device increases, leakage also increases. As bias current is increased to offset increased leakage, the increased bias current reduces the substrate bias voltage making the substrate bias voltage a smaller negative value. When the substrate bias has a lower negative voltage, the probability of a spurious signal causing latchup is increased. Due to density requirements in DRAM devices, the MOS transistor switches are fabricated with very narrow channels. These narrow channel MOS transistors generally require a substantial level of substrate bias to reduce subthreshold leakage current sufficiently to maintain the stored data throughout a refresh interval required by the system. As a result, charge pump circuits must be designed to provide greater charge pumping efficiency for ensuring that the level of substrate bias potential is a sufficiently large negative potential to prevent erroneous operation.

In prior art substrate bias pump arrangements, a pumping diode is interposed between each of the pumping capacitors and the substrate. When the pumping capacitors are discharged through the pumping diodes, a voltage drop occurs across the pumping diodes. That voltage drop equals a diode threshold voltage, which reduces the maximum negative potential of the substrate to the magnitude of the potential of charge stored in the pumping capacitor less the diode threshold voltage, or $-V_{dd}+V_{tp}$. In a battery powered arrangement, the resulting bias is approximately −0.8 volts. This potential is too close to ground potential for many uses.

SUMMARY OF THE INVENTION

These and other problems are resolved by an integrated circuit substrate bias pumping arrangement that includes a charge pump circuit arranged as a circuit path from an oscillator input to the substrate. The charge pump circuit operates to supply charge to the substrate in response to a level of the oscillator signal. In the charge pump circuit, a bootstrap controlled pumping transistor transfers stored charge from a pumping capacitor to the substrate without imparting all of a threshold voltage of the pumping transistor as a voltage loss.

The pumping transistor has its conduction path connected in a series circuit between the pumping capacitor and the substrate.

A control gate electrode of the pumping transistor is bootstrapped to turn on the pumping transistor by a delayed version of the oscillator signal.

Two of the charge pump circuits can be operated in a push-pull configuration, substrate bias pump.

BRIEF DESCRIPTION OF THE DRAWING

The invention may be better understood by reading the subsequent detailed description with reference to the drawing wherein.

DETAILED DESCRIPTION

Figure 1:
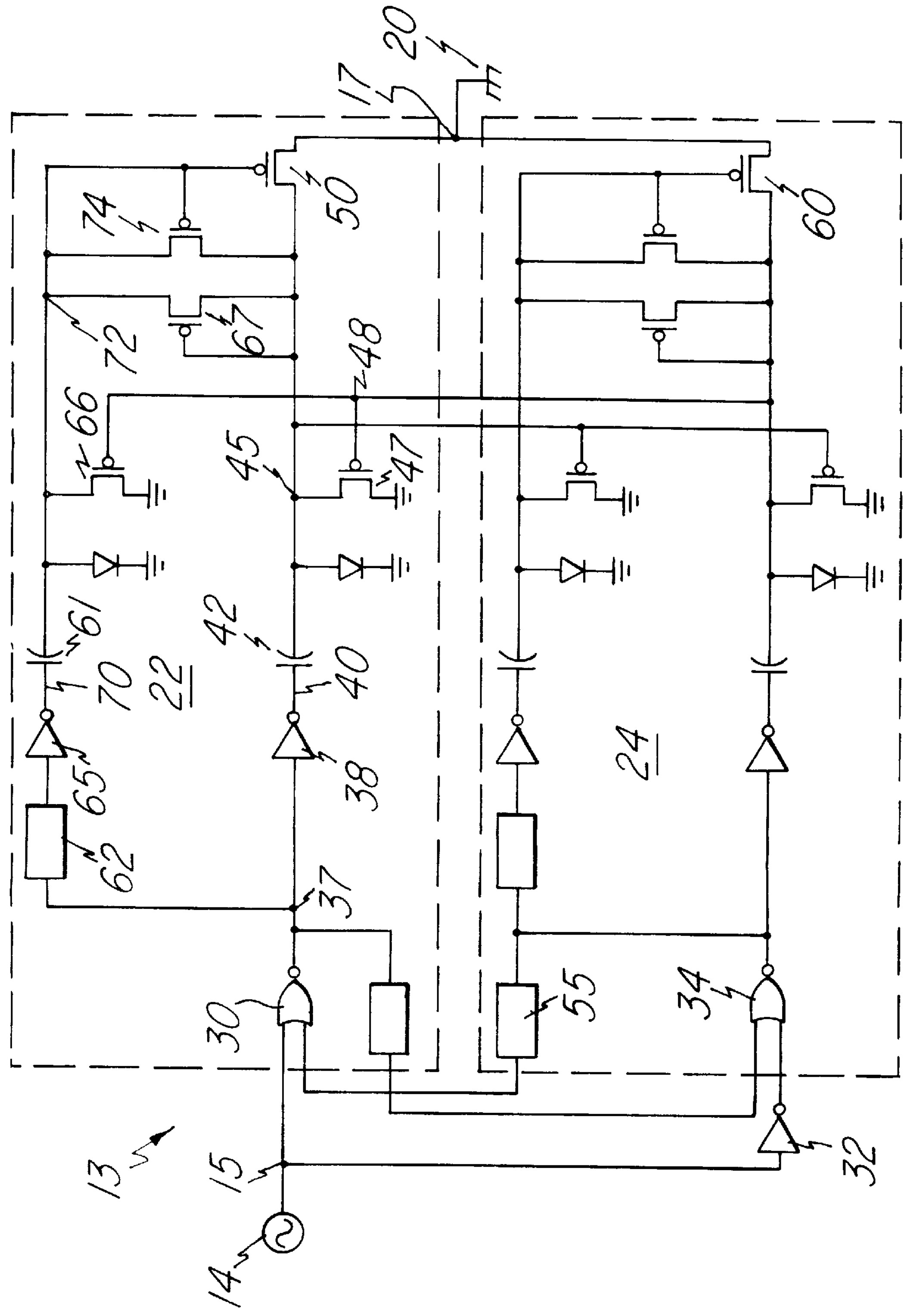
FIG. 1 is a schematic diagram of an integrated circuit substrate bias pumping arrangement.
Figure 2:
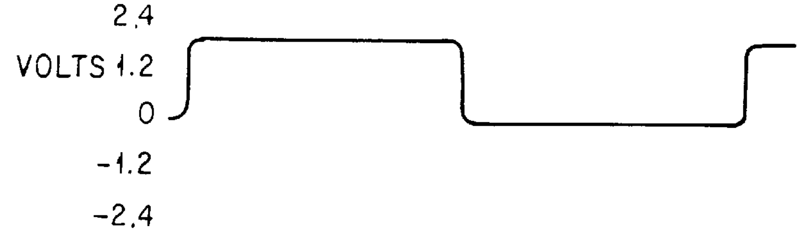
FIG. 2 is a waveform representing an input signal that is applied to the arrangements of FIGS. 1 and 10.
Figure 9:
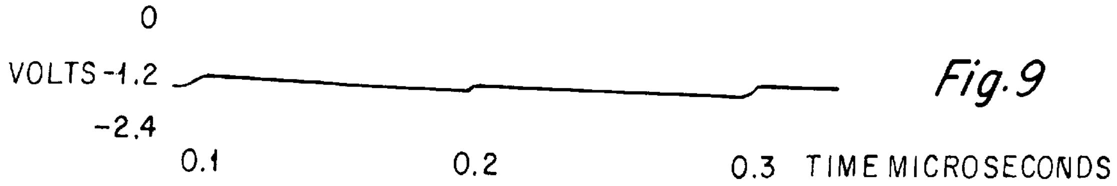
FIG. 9 is a waveform representing the bias potential of the substrate associated with the arrangements of FIGS. 1 and 10.

Referring now to FIG. 1, there is shown an integrated circuit substrate bias pumping arrangement 13. An oscillator 14 applies an alternating high level, low level, square wave signal, as shown in FIG. 2, to an input terminal 15 of the substrate bias pumping arrangement 13. An output terminal 17 of the substrate bias pumping arrangement 13 is maintained at a substrate bias potential of an integrated circuit substrate 20, as shown in FIG. 9. The substrate bias pumping arrangement includes a pair of charge pump circuits 22 and 24 which provide separate circuit paths between the input terminal 15 and the output terminal 17 that connects with the substrate 20. Each of the charge pump circuits, e.g. 22, operates on one level of the input signal of FIG. 2 while the other charge pump circuit, e.g. 24, is cutoff. Then they reverse roles, as in a push-pull circuit. Operation of the charge pump circuits 22 and 24 is described hereinafter.

The configurations of the charge pump circuits 22 and 24 are alike and therefor operate similar to each other except that input signals occurring on the input terminal 15 are applied directly to an input of a NOR gate 30 of the charge pump circuit 22 and through an inverter 32 to an input of a NOR gate 34 of the charge pump circuit 24. Low level swings of the input signal cause charge pump circuit 22 to pump the substrate bias to a negative potential, and high level swings cause the charge pump circuit 24 to pump the substrate bias to the negative potential. Since the charge pump circuits 22 and 24 are otherwise similar, the subsequent description of their arrangement and operation is confined to those of the circuit 22.

With reference to the waveforms of FIGS. 2–9, the operation of the substrate bias pumping arrangement of FIG. 1 is described as follows.

Figure 3:
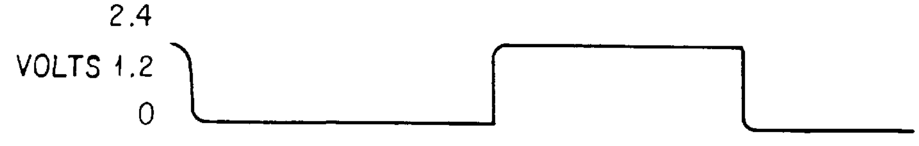
FIG. 3 is a waveform representing the output of a NOR gate included in the arrangements of FIGS. 1 and 10.
Figure 4:
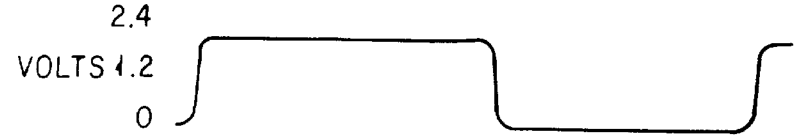
FIG. 4 is a waveform representing the potential on one plate of a first pumping capacitor shown in the arrangements of FIGS. 1 and 10 and a second pumping capacitor also shown in the arrangement of FIG. 10.
Figure 5:
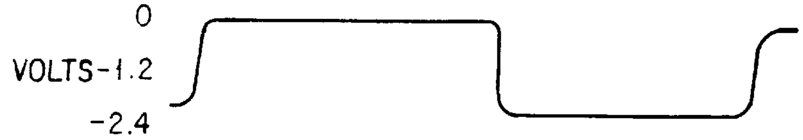
FIG. 5 is a waveform representing the potential on the opposite plate of the first pumping capacitor of the arrangements of FIGS. 1 and 10.
Figure 6:
FIG. 6 is a waveform representing a control signal cross-coupled from one circuit to another within the arrangements of FIGS. 1 and 10.

To start, consider that the input signal of FIG. 2 goes to a high positive level. Since this is applied to one input of the NOR gate 30, that gate produces a low, ground level, signal on a node 37, as shown in FIG. 3. In turn, an inverter 38 produces a high level signal, as shown in FIG. 4, at its output on a node 40 which is one plate of a pumping capacitor 42. An opposite plate of the pumping capacitor 42 is connected by way of a node 45 that goes to ground level, as shown in FIG. 5, because of coupling through the pumping capacitor 42 and because a transistor 47 is turned on by a cross-coupled negative level control signal on a lead 48 from the charge pump circuit 24, as shown in FIG. 6. A p-channel pumping transistor 50 has its conduction path connected in a series circuit with the pumping capacitor 42 between the input terminal 15 and the substrate 20.

Figure 8:
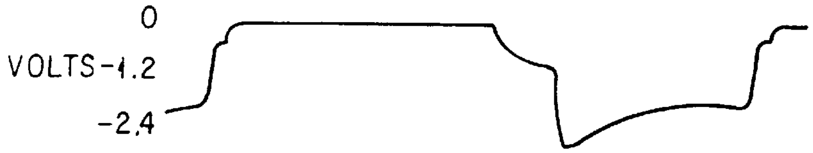
FIG. 8 is a waveform representing the potential on the opposite plate of the bootstrap capacitor of the arrangement of FIG. 1.

Advantageously, the pumping transistor 50 is turned off when the input signal on node 15 is high because a transistor 66 similarly is turned on by the cross-coupled negative level control signal on the lead 48. Potential at a node 72 and on a control gate electrode of the transistor 50 is at ground level, as shown in FIG. 8. At this time, the charge pump circuit 24 is pumping charge into the substrate 20. The charge being pumped from the charge pump circuit 24 is directed to the substrate 20 and is prevented from being directed through the pumping transistor 50 into the pumping capacitor 42 because the transistor 50 is not conducting.

With the node 40 being at a high level, as shown in FIG. 4, and the node 45 being at ground level, as shown in FIG. 5, the pumping capacitor 42 is recharged to a full potential $V_{dd}$ prior to its next turn to supply charge through the pumping transistor 50 and the output terminal 17 to the substrate 20.

Once the high positive level portion of the input signal is completed, the input signal, shown in FIG. 2, swings to a low level. Although this low level input signal is applied to the one input terminal of the NOR gate 30, the state of the NOR gate 30 does not change immediately. Instead it waits for a delayed control signal transition from the charge pump circuit 24. The NOR gate 30 output on node 37 is held low until a low-going signal transition from the charge pump circuit 24 is coupled through a delay element 55 to a second input of the NOR gate 30. This delay assures that the pumping p-channel transistor 60 of the charge pump circuit 24 is turned off before the pumping transistor 50 of the charge pump circuit 22 is turned on during this low level portion of the input signal. Turning off the pumping transistor 60 of the charge pump circuit 24 ensures that no charge pumped through the pumping transistor 50 of the charge pump circuit 22 is directed into the charge pumping circuit 24. Advantageously, all of the charge pumped through the pumping transistor 50 is directed into the substrate 20.

Once the second input of the NOR gate 30 goes low, the node 37 changes to a high positive potential level, as shown in FIG. 3, and the node 40 goes to a low, ground level, as shown in FIG. 4. Since the pumping capacitor 42 has been charged previously to a full potential $V_{dd}$, it changes the potential on the node 45 to an almost full negative potential $-V_{dd}$ when the node 40 is driven to the low level.

Figure 7:
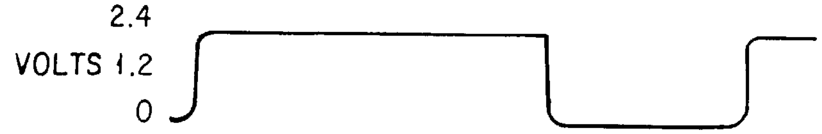
FIG. 7 is a waveform representing the potential on one plate of a bootstrap capacitor of the arrangements of FIGS. 1 and 10.

In order to operate the pumping transistor 50 when the charge pump circuit 22 is pumping charge into the substrate 20, a bootstrap circuit is interposed between the input terminal and a control electrode of the pumping transistor 50. In the bootstrap circuit, a bootstrap capacitor 61 is connected in a separate circuit path between the node 37 and the control electrode of the pumping transistor 50. Signals from the node 37 are delayed by a delay element 62 and are inverted in polarity at an output node 70 of an inverter 65 before being applied to one plate of the bootstrap capacitor 61. The signal at the node 70 is shown in FIG. 7. The other plate of the bootstrap capacitor 61 is a node 72 that is connected directly to the control gate electrode of the pumping transistor 50 for applying on/off control signals to the pumping transistor 50.

A transistor 66 is responsive to the control signal cross-coupled from the charge pump circuit 24 on the lead 48, as shown in FIG. 6, for restoring the potential on the node 72 at the control gate electrode of the pumping transistor 50 to ground potential, as shown in FIG. 8, prior to the charge pump circuit 22 pumping charge into the substrate.

An MOS transistor 67 has a connection from its gate electrode to its drain electrode to form a diode device. This is a bootstrap charging diode that is connected between the control gate and drain electrodes of the pumping transistor 50.

During operation when the input signal changes from the high level to the low level, the potentials on the nodes 15 and 40 go low, as shown in FIGS. 2 and 4, and the signal on the node 45 goes to a potential $-V_{dd}$, as shown in FIG. 5. The signal transition from high to low on the node 70 is delayed by the delay element 62, as shown in FIG. 7, and the node 72 is precharged through the bootstrap charging diode 67 during the delay time to a potential $-V_{dd}+V_{tp}$, as shown in FIG. 8. Thus charge stored in the bootstrap capacitor 61 reaches a potential of $2V_{dd}-V_{tp}$. After the delay time expires, the node 72 and the control gate of the pumping transistor are bootstrapped to the potential $-2V_{dd}+V_{tp}$ for enabling the pumping transistor 50 to conduct, as shown in FIG. 8. While the pumping transistor 50 is enabled, the charge from the pumping capacitor 42 is discharged to the substrate 20. Because the pumping transistor 50 is enabled, loss through its conducting path is less than a threshold voltage $V_{tp}$ and may be zero volts. The substrate potential $V_{bb}$ can be pumped down to a maximum negative potential of $-2V_{dd}+2V_{tp}$ before it turns off the pumping transistor 50.

A bleeder transistor 74, connected in a diode configuration, allows slow discharge from the node 72 during the time the pumping transistor 50 is enabled to conduct, as further shown in FIG. 8. Bleeder transistor 74 is sized so that whenever the substrate potential $V_{bb}$, as shown in FIG. 9, is near the potential $V_{ss}$, the potential on the node 72 is gradually discharged to a potential of $-V_{bb}-V_{tp}$ before pumping is switched to the charge pump circuit 24. This potential of $-V_{bb}-V_{tp}$ on the node 72 assures that the pumping transistor 50 is turned off when the charge pump circuit 24 commences pumping charge to the substrate 20.

An advantage of the substrate bias pumping arrangement 13 is that as charge flows from the substrate 20 causing the potential to rise on the node 45 and on the drain of the pumping transistor 50, that transistor is not cutoff. The potential on the node 72 and the control gate electrode of the transistor 50 is separately controlled from the potential on the node 45. Because of the bleeder transistor 74 and the delay of the bootstrapping of the control gate electrode of the pumping transistor 50, the charge pumping to the substrate occurs through a lower magnitude effective resistance and at a higher efficiency than was possible in the prior art.

Another advantage over the prior art, is that the substrate bias theoretically can be pumped to a negative potential of $-2V_{dd}+2V_{tp}$. In actual practice for an operating battery supply $V_{dd}$ of 2 volts, the substrate bias $V_{bb}$ can be pumped to approximately −1.4 volts.

Advantageously, either of the charge pump circuits 22 or 24 can be operated individually as a substrate bias pump. When the individual charge pump circuit, e.g., 22 is so operated, the control lead 48 is connected to ground potential for controlling the operation of the transistors 66 and 47.

Figure 10:
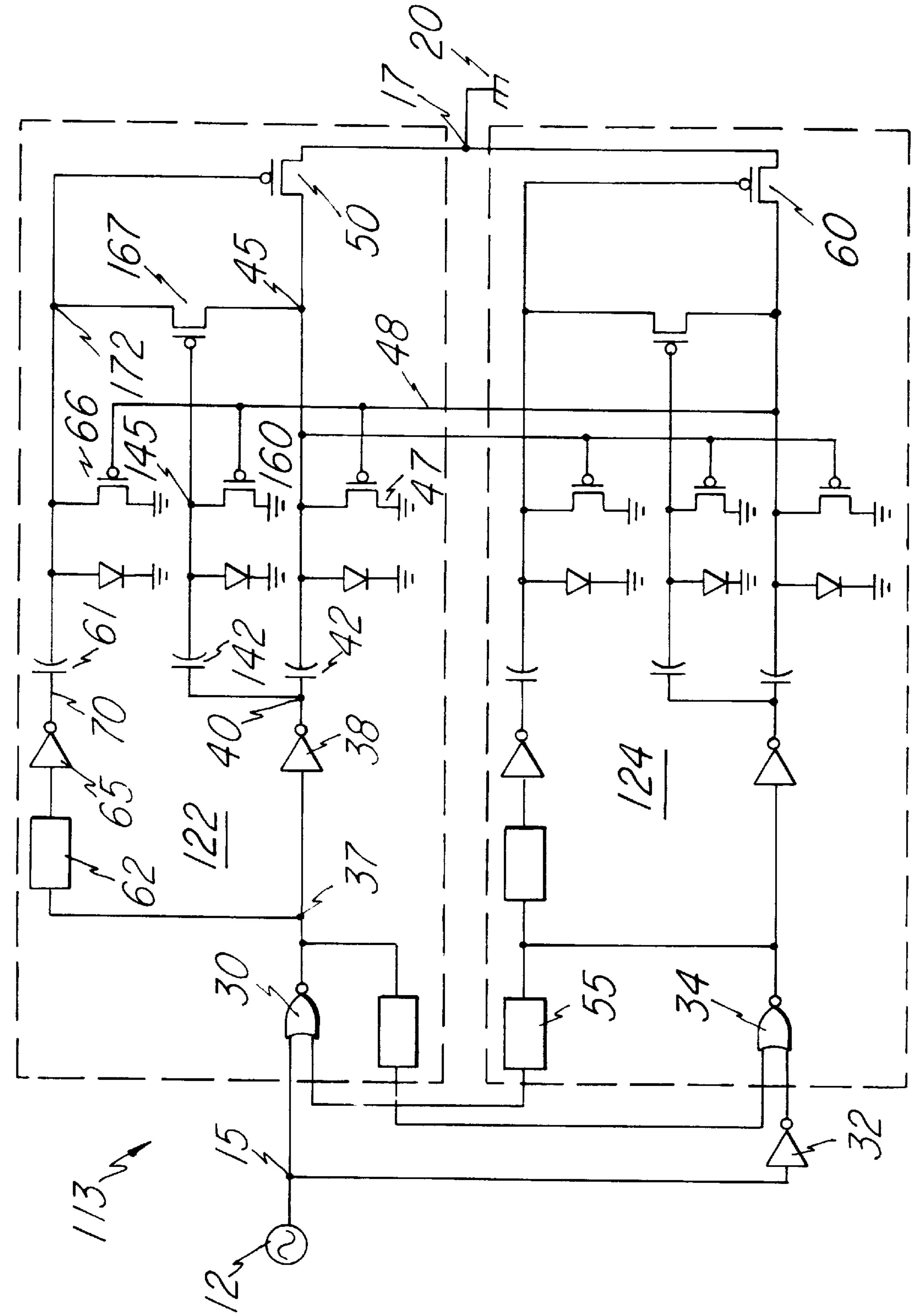
FIG. 10 is a schematic diagram of another integrated circuit substrate bias pumping arrangement.

Referring now to FIG. 10, there is shown a schematic diagram of an alternative integrated circuit substrate bias pumping arrangement 113 which is similar to the substrate bias pumping arrangement 13 of FIG. 1. Elements of the substrate bias pumping arrangement 113 which are similar to the elements of the arrangement 13 are identified by the same numerical designator. New and different elements in the arrangement 113 are identified by different numerical designators. Operation of the arrangement 113 also is similar to the operation of the arrangement 13 except with respect to the new and different elements. Waveforms presented in the FIGS. 2 through 7 and 9 are directly applicable to the operation of the arrangement 113 of FIG. 10.

Referring now to the FIGS. 2–7, 9 and 11–12, the operation of the substrate bias pumping arrangement of FIG. 10 is described as follows. A pair of charge pump circuits 122 and 124 provide separate circuit paths from the input terminal 17 to the output terminal 17 and substrate 20. The charge pump circuits 122 and 124 operate alternatively and similarly to the circuits 22 and 24 of FIG. 1 except for a second pumping capacitor arrangement, which is interposed in each of the charge pump circuits 122 and 124.

A second pumping capacitor 142 has a first plate connected to the node 40 and a second plate connected to a node 145 and the control electrode of a bootstrap charging MOS transistor 167. The conduction path through the bootstrap charging MOS transistor 167 couples a node 172 at the control electrode of the pumping p-channel transistor 50 to the drain electrode of the pumping transistor 50.

Figure 11:
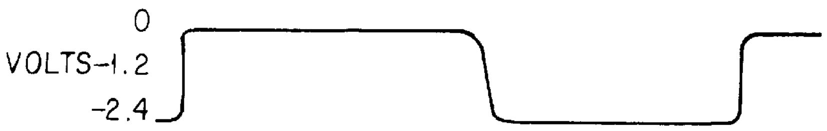
FIG. 11 is a waveform representing the potential on the opposite plate of a second pumping capacitor of the arrangement of FIG. 10.
Figure 12:
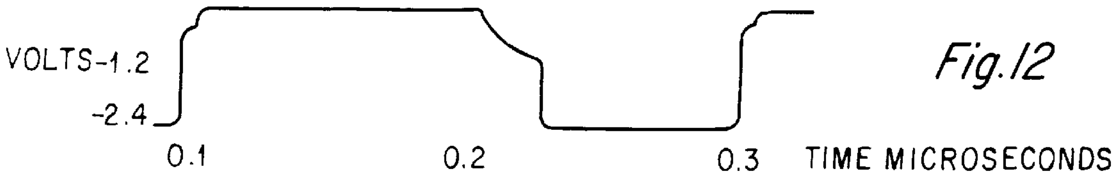
FIG. 12 is a waveform representing the potential on the opposite plate of the bootstrap capacitor of the arrangement of FIG. 10.

When the signal potential on the node 40 is at the high level, the potential on the node 145 is at ground so that the second pumping capacitor 142 charges fully while the charge pump circuit 124 is operating. MOS transistor 160 is enabled by the cross-coupled control signal on the lead 48 to assure that the node 145 is brought to ground, as shown in FIG. 11. Once the input signal on the node 15 changes from the high level to the low level and the delay time of the device 55 expires, the potentials on the nodes 37 and 40 change, as shown in FIGS. 3 and 4. Then the potential on the node 145 goes to a negative potential, as shown in the FIG. 11.

When the potential of the substrate 20 is near the potential $V_{ss}$, the bootstrap charging MOS transistor 167 is operated in a triode region of its characteristics. Node 172 is clamped to the potential of the node 45. As a result, the pumping transistor 50 is configured as a diode that is reverse biased. Charge from the charge pump circuit 124 is prevented from going through the pumping transistor 50 to the pumping capacitor 42. Thus the charge from the charge pump circuit 124 is directed through the node 117 to the substrate 120.

Advantages of the substrate bias pumping arrangement 113 over the prior art are similar to the previously described advantages of the substrate bias pumping arrangement 13 of FIG. 1.

Either charge pump circuit 122 or 124 can be operated independently. The control lead 48 would be connected to the ground potential.

The foregoing describes exemplary substrate bias pumping arrangements which illustrate the features and advantages of the invention. Those arrangements together with others made obvious in view thereof are considered to fall within the scope of the appended claims.

What is claimed is:

1. A substrate bias pumping arrangement comprising:

a charge pump circuit connected in a circuit path between an input terminal and a substrate, the charge pump circuit operating to supply charge to the substrate in response to a level of an input signal applied to the input terminal, the charge pump circuit including:

a pumping capacitor;

a p-channel pumping transistor having a control electrode and having a conduction path connected in a series circuit path with the pumping capacitor between the input terminal and the substrate;

a bootstrap circuit connected between the input terminal and the control electrode for enabling the p-channel pumping transistor to conduct charge from the pumping capacitor to the substrate without imparting all of a threshold voltage of the p-channel pumping transistor as a voltage loss; and a bleeder diode, connected between the control electrode of the p-channel pumping transistor and the pumping capacitor, for at least partially disabling conduction through the p-channel pumping transistor before the level of the input signal terminates.

2. A substrate bias pumping arrangement comprising:

a charge pump circuit connected in a circuit path between an input terminal and a substrate, the charge pump circuit operating to supply charge to the substrate in response to a level of an input signal applied to the input terminal, the charge pump circuit including:

a pumping capacitor;

a p-channel pumping transistor having a control electrode and having a conduction path connected in a series circuit path with the pumping capacitor between the input terminal and the substrate;

a bootstrap circuit connected between the input terminal and the control electrode for enabling the p-channel pumping transistor to conduct charge from the pumping capacitor to the substrate without imparting all of a threshold voltage of the p-channel pumping transistor as a voltage loss; and a bootstrap charging transistor is connected between the control electrode of the p-channel pumping transistor and the pumping capacitor for at least partially disabling conduction through the p-channel pumping transistor before the level of the input signal terminates.

3. A substrate bias pumping arrangement comprising:

first and second charge pump circuits connected in separate circuit paths between an input terminal and a substrate, the first and second charge pump circuits operating alternatively supplying charge to the substrate in response to alternative levels of an input signal applied to the input terminal, each of the charge pump circuits including:

a pumping capacitor;

a p-channel pumping transistor having a control electrode and having a conduction path connected in a series circuit path with the pumping capacitor between the input terminal and the substrate; and a bootstrap circuit connected between the input terminal and the control electrode for enabling the p-channel pumping transistor to conduct charge from the pumping capacitor to the substrate without imparting all of a threshold voltage of the p-channel pumping transistor as a voltage loss.

4. A substrate bias pumping arrangement, in accordance with claim 3, wherein each of the charge pump circuits is connected so that:

one of the alternative levels of the input signal changes potential levels on both plates of the pumping capacitor;

the bootstrap circuit comprises:

a bootstrap capacitor;

a bootstrap charging transistor, responsive to the one of the levels of the input signal for changing charge stored on the bootstrap capacitor;

a delay device, connected between the input terminal and the bootstrap capacitor, for delaying the one of the levels of the input signal until after the potential level is changed on one of the plates of the pumping capacitor; and the potential levels, on both plates of the bootstrap capacitor, shifting after the delay of the one of the levels of the input signal and enabling the p-channel pumping transistor to conduct.

5. A substrate bias pumping arrangement comprising:

first and second charge pump circuits connected in separate circuit paths between an input terminal and a substrate, the first and second charge pump circuits operating alternatively supplying charge to the substrate in response to alternative levels of an input signal applied to the input terminal, each of the charge pump circuits including:

a pumping capacitor;

a p-channel pumping transistor having a control electrode and having a conduction path connected in a series circuit path with the pumping capacitor between the input terminal and the substrate;

a bootstrap circuit connected between the input terminal and the control electrode for enabling the p-channel pumping transistor to conduct charge from the pumping capacitor to the substrate without imparting all of a threshold voltage of the p-channel pumping transistor as a voltage loss; and a bleeder diode, connected between the control electrode of the p-channel pumping transistor and the pumping capacitor, for at least partially disabling conduction through the p-channel pumping transistor before the one of the levels of the input signal terminates.

6. A substrate bias pumping arrangement comprising:

first and second charge pump circuits connected in separate circuit paths between an input terminal and a substrate, the first and second charge pump circuits operating alternatively supplying charge to the substrate in response to alternative levels of an input signal applied to the input terminal, each of the charge pump circuits including:

a pumping capacitor;

a p-channel pumping transistor having a control electrode and having a conduction path connected in a series circuit path with the pumping capacitor between the input terminal and the substrate;

a bootstrap circuit connected between the input terminal and the control electrode for enabling the p-channel pumping transistor to conduct charge from the pumping capacitor to the substrate without imparting all of a threshold voltage of the p-channel pumping transistor as a voltage loss; and the bootstrap charging transistor is connected between the control electrode of the p-channel pumping transistor and the pumping capacitor for at least partially disabling conduction through the p-channel pumping transistor before the one of the levels of the input signal terminates.

7. A substrate bias pumping arrangement comprising:

first and second charge pump circuits connected in separate circuit paths between an input terminal and a substrate, the first and second charge pump circuits operating alternatively supplying charge to the substrate in response to alternative levels of an input signal applied to the input terminal, each of the charge pump circuits including:

a pumping capacitor;

a p-channel pumping transistor having a control electrode and having a conduction path connected in a series circuit path with the pumping capacitor between the input terminal and the substrate;

a bootstrap circuit connected between the input terminal and the control electrode for enabling the p-channel pumping transistor to conduct charge from the pumping capacitor to the substrate without imparting all of a threshold voltage of the p-channel pumping transistor as a voltage loss;

first and second delay circuits;

a first control signal from the second charge pump circuit traverses the first delay circuit before being applied to a first pumping capacitor and a first bootstrap circuit of the first charge pump circuit for initiating discharge of charge from the first pumping capacitor through a first one of the p-channel pumping transistors to the substrate after a second one of the p-channel pumping transistors in the second charge pump circuit is turned off; and a second control signal from the first charge pump circuit traverses the second delay circuit before being applied to a second pumping capacitor and a second bootstrap circuit of the second charge pump circuit for initiating discharge of charge from the second pumping capacitor through a second one of the p-channel pumping transistors to the substrate after the first one of the p-channel pumping transistors is turned off.

8. A substrate bias pumping arrangement comprising:

first and second charge pump circuits connected in separate circuit paths between an input terminal and a substrate, the first and second charge pump circuits operating alternatively supplying charge to the substrate in response to alternative levels of an input signal applied to the input terminal, each of the charge pump circuits including:

a pumping capacitor;

a p-channel pumping transistor having a control electrode and having a conduction path connected in a series circuit path with the pumping capacitor between the input terminal and the substrate;

a bootstrap circuit connected between the input terminal and the control electrode for enabling the p-channel pumping transistor to conduct charge from the pumping capacitor to the substrate without imparting all of a threshold voltage of the p-channel pumping transistor as a voltage loss;

another charge pumping capacitor; and the bootstrap charging transistor having a conduction path from the control electrode of the p-channel pumping transistor to a drain electrode of the p-channel pumping transistor, the bootstrap charging transistor further having a control electrode connected with the another charge pumping capacitor for enabling the bootstrap charging transistor to restore a potential level at the drain electrode of the p-channel pumping transistor each of the charge pump circuits is connected so that:

one of the alternative levels of the input signal changes potential levels on both plates of the pumping capacitor;

the bootstrap circuit comprises:

a bootstrap capacitor;

a bootstrap charging transistor, responsive to the one of the levels of the input signal for changing charge stored on the bootstrap capacitor;

a delay device, connected between the input terminal and the bootstrap capacitor, for delaying the one of the levels of the input signal until after the potential level is changed on one of the plates of the pumping capacitor; and the potential levels, on both plates of the bootstrap capacitor, shifting after the delay of the one of the levels of the input signal and enabling the p-channel pumping transistor to conduct.

9. A substrate bias pumping arrangement comprising:

first and second charge pump circuits connected in separate circuit paths between an input terminal and a substrate, each of the charge pump circuits including:

a pumping capacitor having a first plate coupled to the input terminal;

a pumping transistor having a conduction path coupling a second plate of the pumping capacitor to the substrate;

a time delay element;

a bootstrap capacitor having a first plate connected for receiving signals coupled from the input terminal through the time delay element to the first plate;

a bootstrap charging diode coupled to conduct from a second plate of the bootstrap capacitor to the second plate of the pumping capacitor;

a bleeder diode coupled to conduct from the second plate of the bootstrap capacitor to the second plate of the pumping capacitor; and the second plate of the bootstrap capacitor connected to a control electrode of the pumping transistor.

10. A substrate bias pumping arrangement comprising:

first and second charge pump circuits connected in separate circuit paths between an input terminal and a substrate, each of the charge pump circuits including:

a first pumping capacitor having a first plate coupled to the input terminal;

a pumping transistor having a conduction path coupling a second plate of the first pumping capacitor to the substrate;

a second pumping capacitor having a first plate coupled to the input terminal;

a time delay element;

a bootstrap capacitor having a first plate connected for receiving signals coupled from the input terminal through the time delay element to the first plate;

a bootstrap charging transistor having a conduction path coupling the second plate of the bootstrap capacitor to the second plate of the first pumping capacitor and a control electrode connected with the second plate of the second pumping capacitor; and the second plate of the bootstrap capacitor connected to a control electrode of the pumping transistor.

11. A substrate bias pumping arrangement comprising:

a charge pump circuit connected in a circuit path between an input terminal and a substrate, the charge pump circuit including:

a first pumping capacitor having a first plate coupled to the input terminal;

a pumping transistor having a conduction path coupling a second plate of the first pumping capacitor to the substrate;

a second pumping capacitor having a first plate coupled to the input terminal;

a time delay element;

a bootstrap capacitor having a first plate connected for receiving signals coupled from the input terminal through the time delay element to the first plate;

a bootstrap charging transistor having a conduction path coupling the second plate of the bootstrap capacitor to the second plate of the first pumping capacitor and a control electrode connected with the second plate of the second pumping capacitor; and the second plate of the bootstrap capacitor connected to a control electrode of the pumping transistor.

12. A substrate bias pumping arrangement comprising:

a charge pump circuit connected in a circuit path between an input terminal and a substrate, the charge pump circuit operating to supply charge to the substrate in response to a level of an input signal applied to the input terminal, the charge pump circuit including:

a pumping capacitor;

a p-channel pumping transistor having a control electrode and having a conduction path connected in a series circuit path with the pumping capacitor between the input terminal and the substrate; and a bootstrap circuit connected between the input terminal and the control electrode for applying to the control electrode a voltage that swings substantially to the magnitude of the power supply Vcc below ground and thereby enabling the p-channel pumping transistor to conduct charge from the pumping capacitor to the substrate without imparting all of a threshold voltage of the p-channel pumping transistor as a voltage loss.

13. A substrate bias pumping arrangement, in accordance with claim 12, wherein:

the level of the input signal changes potential levels on both plates of the pumping capacitor;

the bootstrap circuit comprises:

a bootstrap capacitor;

a bootstrap charging transistor, responsive to the level of the input signal for changing charge stored on the bootstrap capacitor;

a delay device, connected between the input terminal and the bootstrap capacitor, for delaying the level of the input signal until after the potential level is changed on one plate of the pumping capacitor; and the potential levels, on both plates of the bootstrap capacitor, shifting after the delay of the level of the input signal and enabling the p-channel pumping transistor to conduct.

* * * * *